United States Patent
Oinuma et al.

(10) Patent No.: US 12,198,894 B2
(45) Date of Patent: Jan. 14, 2025

(54) MEASUREMENT SYSTEM AND METHOD OF SETTING PARAMETER OF CHARGED PARTICLE BEAM DEVICE

(71) Applicant: Hitachi High-Tech Corporation, Tokyo (JP)

(72) Inventors: Hiroshi Oinuma, Tokyo (JP); Kazuki Ikeda, Tokyo (JP); Wen Li, Tokyo (JP); Masashi Wada, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 370 days.

(21) Appl. No.: 17/795,367

(22) PCT Filed: Feb. 5, 2020

(86) PCT No.: PCT/JP2020/004385
§ 371 (c)(1),
(2) Date: Jul. 26, 2022

(87) PCT Pub. No.: WO2021/156976
PCT Pub. Date: Aug. 12, 2021

(65) Prior Publication Data
US 2023/0059414 A1  Feb. 23, 2023

(51) Int. Cl.
  *H01J 37/24* (2006.01)
  *H01J 37/26* (2006.01)
  *H01J 37/28* (2006.01)

(52) U.S. Cl.
  CPC .......... *H01J 37/263* (2013.01); *H01J 37/24* (2013.01); *H01J 37/28* (2013.01)

(58) Field of Classification Search
  CPC .......... H01J 37/263; H01J 37/24; H01J 37/28; H01J 2237/24495; H01J 37/222; H01J 37/244; H01J 37/265
  See application file for complete search history.

(56) References Cited

U.S. PATENT DOCUMENTS

2006/0278826 A1* 12/2006 Roberts ............. H01J 37/28
                                                         250/310
2013/0206986 A1   8/2013 Suzuki et al.
                (Continued)

FOREIGN PATENT DOCUMENTS

JP   2001-148230 A   5/2001
JP   2005-026192 A   1/2005
           (Continued)

*Primary Examiner* — David E Smith
*Assistant Examiner* — Christopher J Gassen
(74) *Attorney, Agent, or Firm* — Volpe Koenig

(57) ABSTRACT

A method of setting a parameter of a charged particle beam device, for shortening the time required to adjust an ABCC parameter. An inverse conversion processing unit generates a simulator input signal corresponding to an electron emitted from a sample. A simulation detector uses an arithmetic model that simulates a detector and executes arithmetic processing on the simulator input signal in a state in which characteristic information is reflected in an arithmetic parameter. A simulated image conversion unit executes arithmetic processing corresponding to an image conversion unit and converts a signal from the simulation detector into a simulated image. An ABCC search unit searches for an ABCC parameter with respect to the simulation detector so that an evaluation value obtained from the simulated image becomes a specified reference value, and outputs the ABCC parameter as a search result to an ABCC control unit of the actual machine.

14 Claims, 11 Drawing Sheets

(56) References Cited

U.S. PATENT DOCUMENTS

| | | | |
|---|---|---|---|
| 2015/0371819 A1* | 12/2015 | Li | H01J 37/28 |
| | | | 250/310 |
| 2017/0336335 A1* | 11/2017 | Hendrich | H01J 37/263 |
| 2019/0362931 A1 | 11/2019 | Watanabe et al. | |

FOREIGN PATENT DOCUMENTS

| | | |
|---|---|---|
| JP | 2007-329081 A | 12/2007 |
| JP | 2013-168215 A | 8/2013 |
| WO | 2018/138875 A1 | 8/2018 |

\* cited by examiner

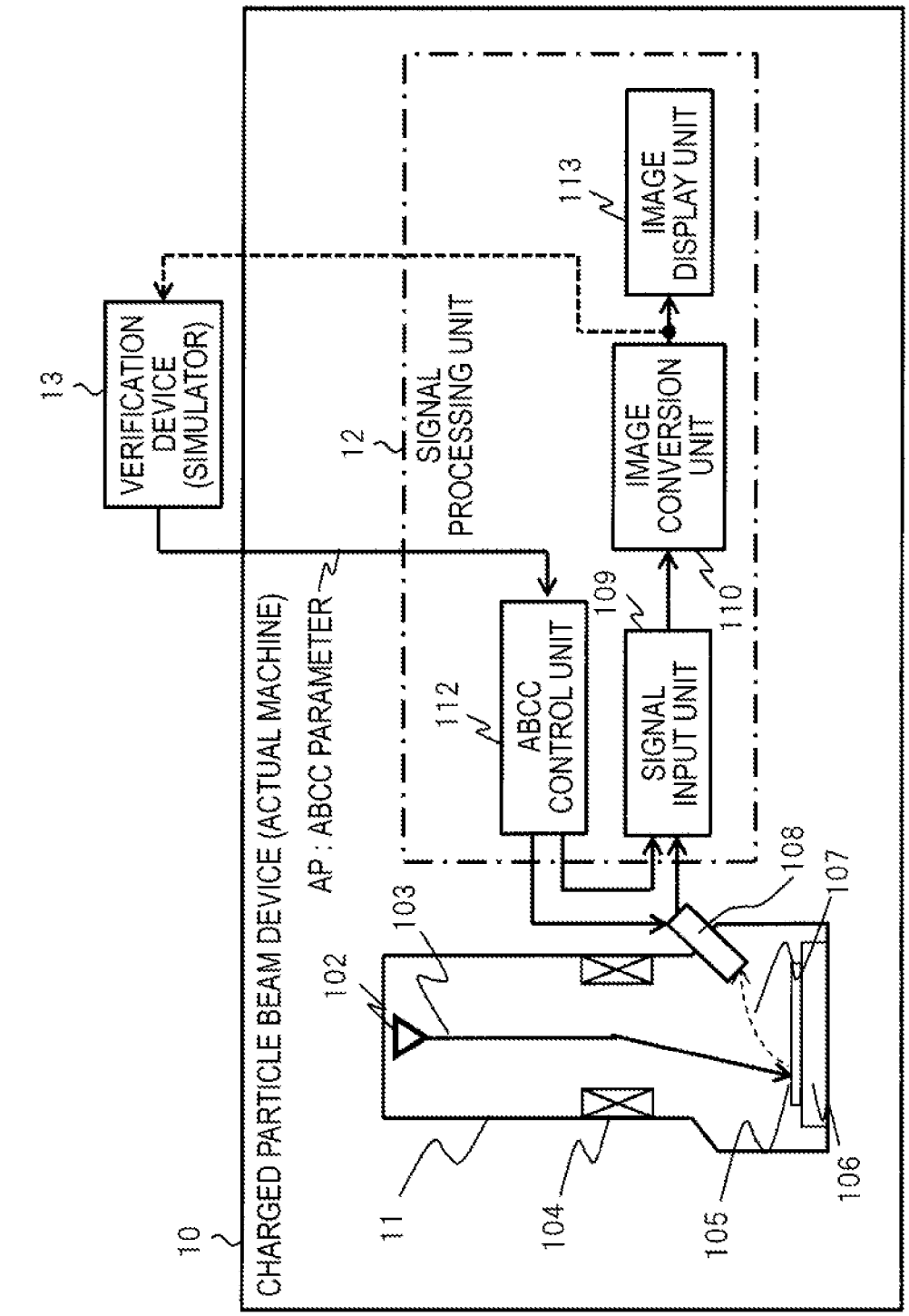
[FIG. 1]

[FIG. 2]
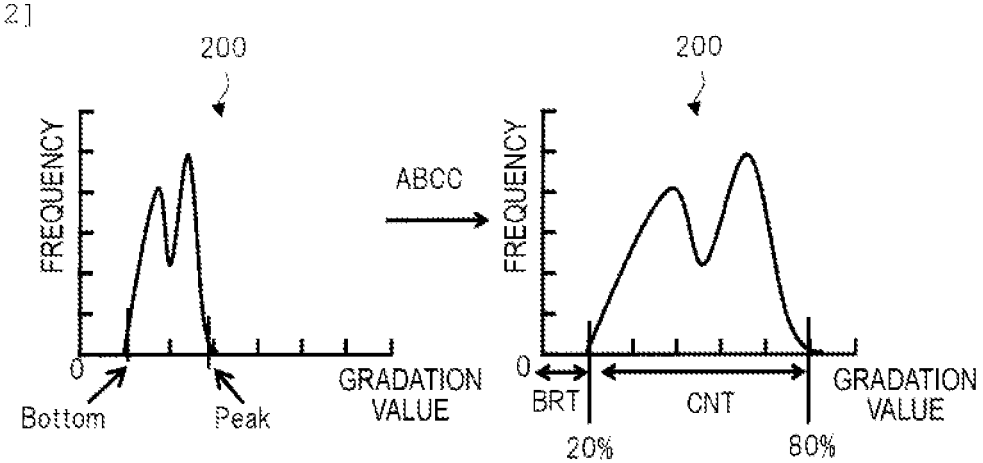

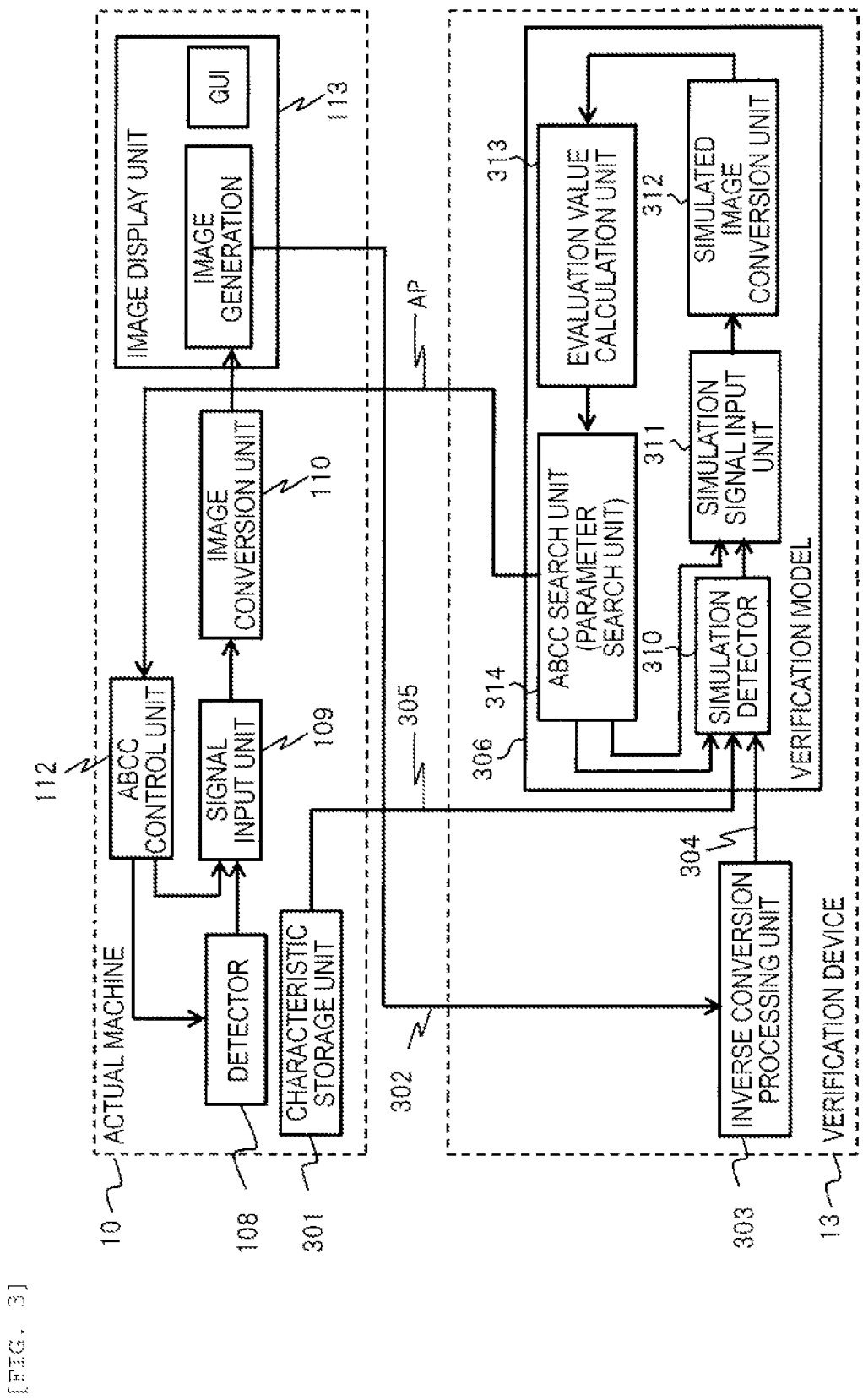
[FIG. 3]

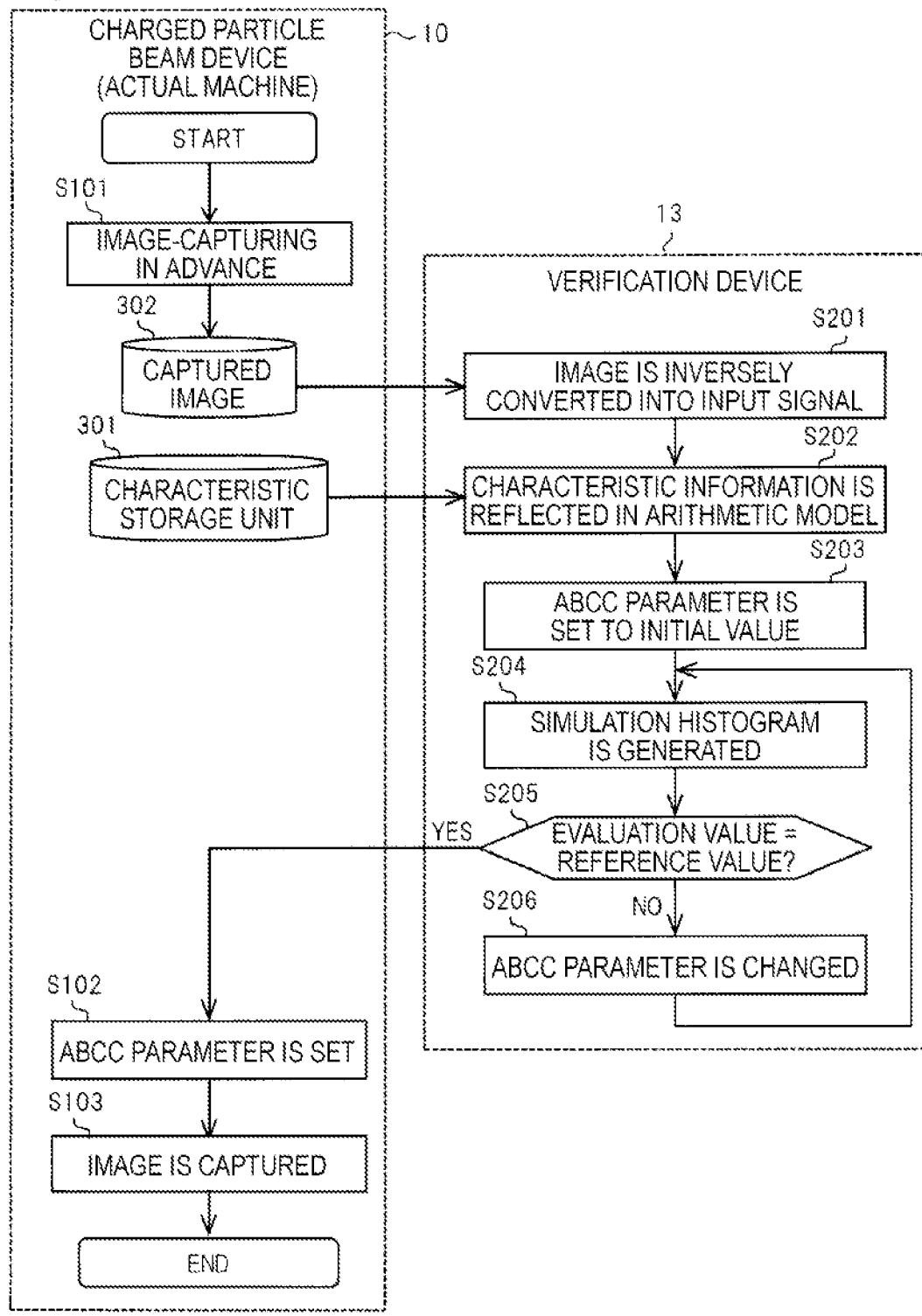
[FIG. 5]

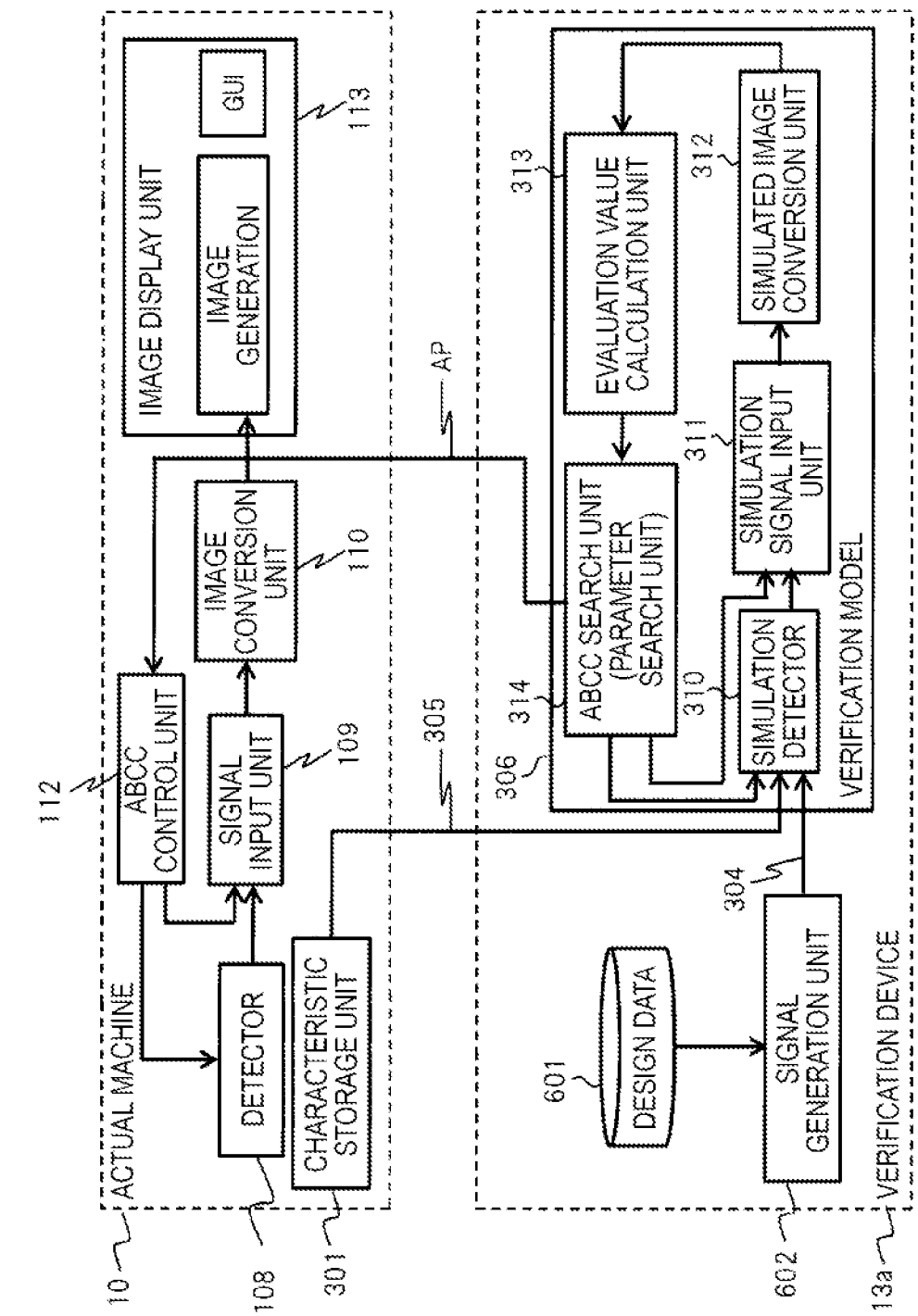
[FIG. 6]

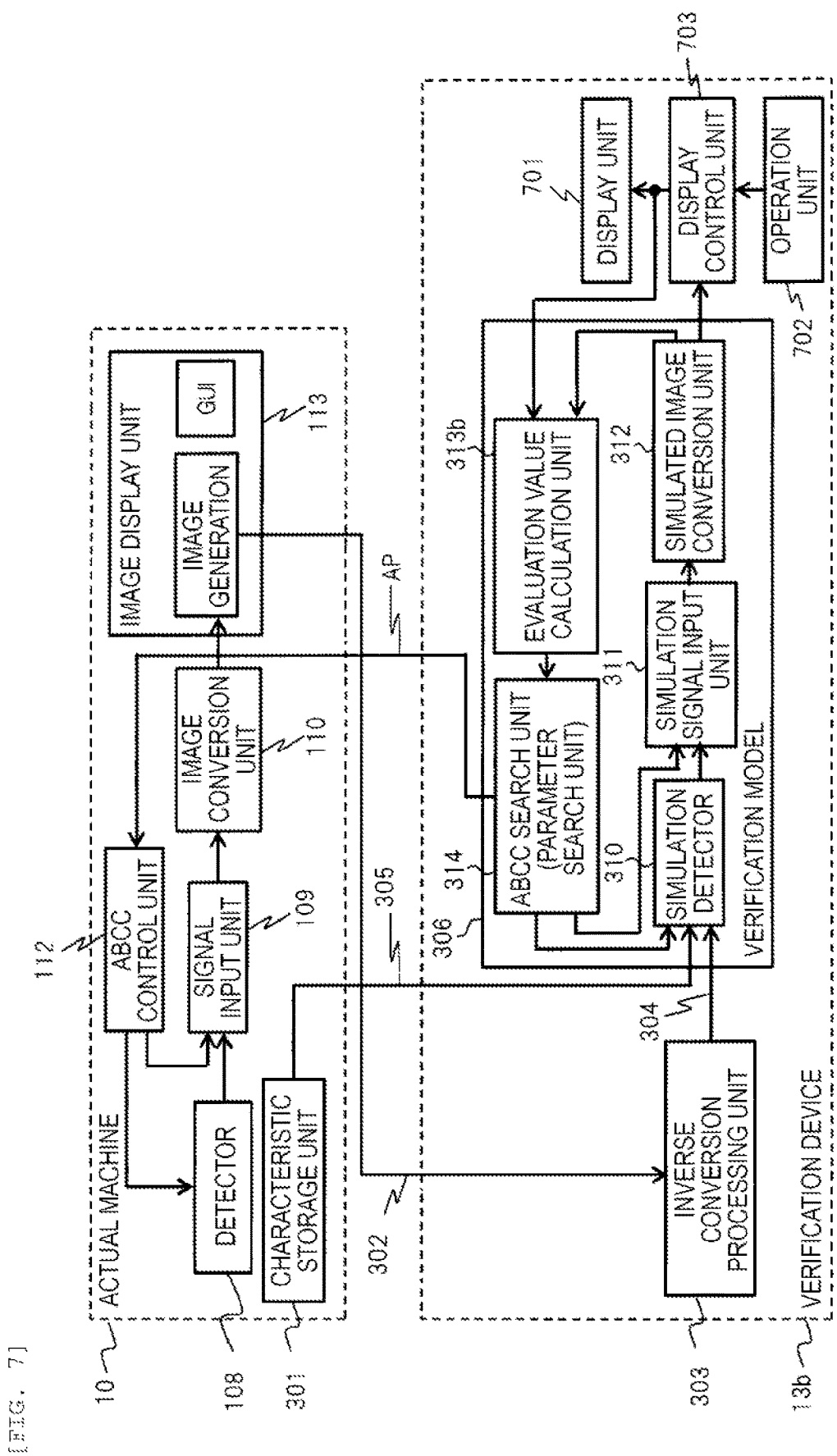
[FIG. 7]

[FIG. 8]
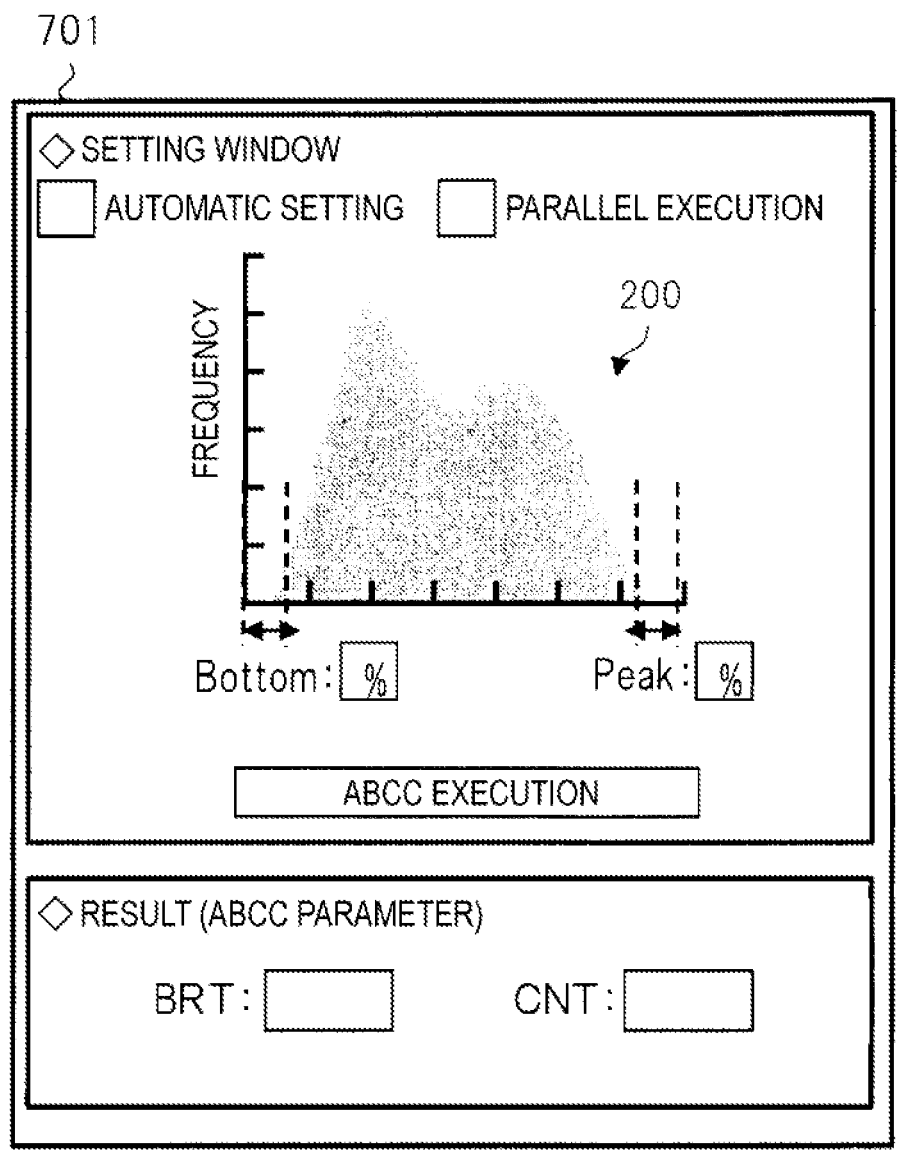

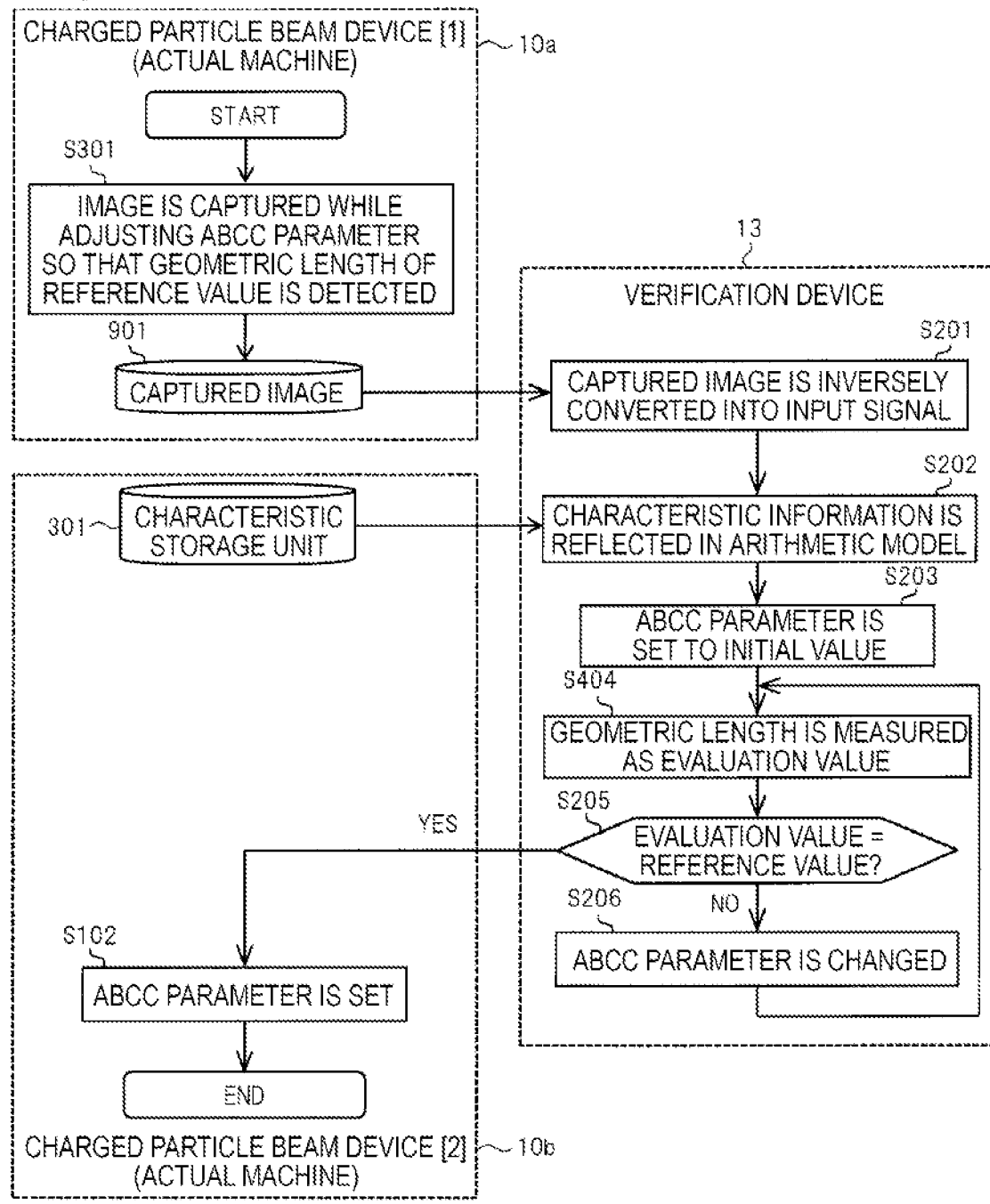
[FIG. 9]

[FIG. 10]
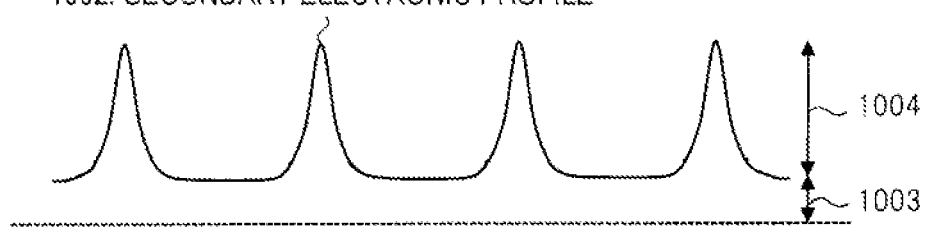
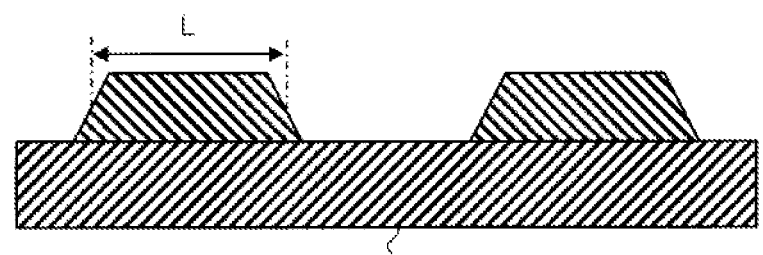

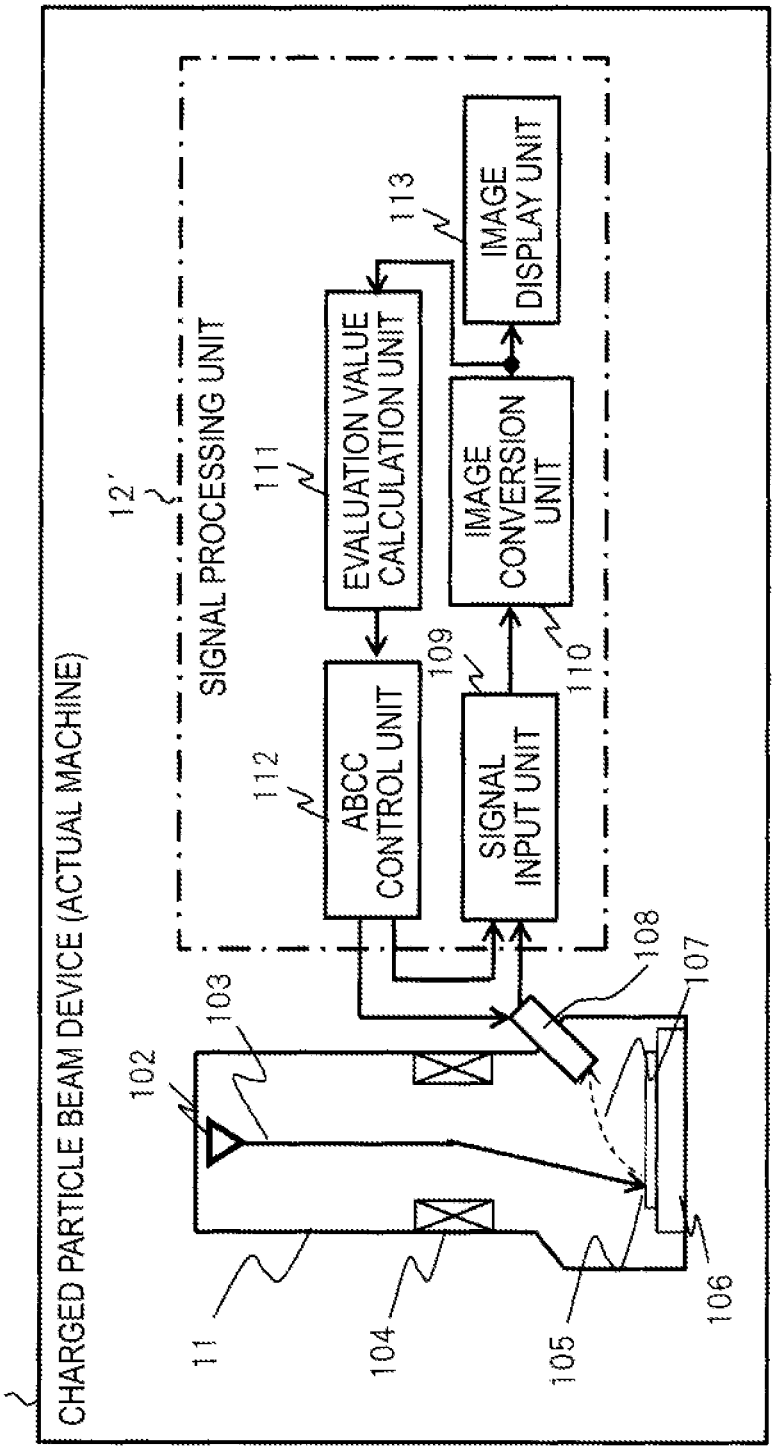

MEASUREMENT SYSTEM AND METHOD OF SETTING PARAMETER OF CHARGED PARTICLE BEAM DEVICE

FIELD

The present invention relates to a measurement system and a method of setting a parameter of a charged particle beam device, and more particularly, to technology of adjusting and setting an ABCC (Auto Brightness Contrast Control) parameter of a charged particle beam device.

BACKGROUND ART

As a background art in this technical field, in WO-A-2018/138875 (PTL 1), disclosed is a charge, particle beam device configured to adjust contrast by performing statistical processing of a gradation value in a predetermined region of an image generated based on a detector output. Specifically, the charged particle beam device is configured to obtain a difference between a statistical value obtained by the statistical processing and reference data related to a gradation value of an image, and to obtain an appropriate amount of gain adjustment based on an arithmetic formula or a table in which a relationship between the difference and the amount of the gain adjustment is predetermined.

CITATION LIST

Patent Literature

PTL 1: WO-A-2018/138875

SUMMARY OF INVENTION

Technical Problem

As one of the charged particle beam devices, a scanning electron microscope (SEM) is known. The SEM is configured to irradiate a sample with an electron beam, and to form a scanned image by detecting a secondary electron beam or the like generated by irradiation of the electron beam using a detector. In this case, the SEM can obtain a two-dimensional scanned image such as unevenness or the like on a surface of the sample by irradiating a sample stage with an electron beam or two-dimensionally scanning the same.

In order to display and observe the scanned image, it is desirable that brightness and contrast of the image be set appropriately. ABCC is known as a function of automatically and appropriately adjusting the brightness and contrast thereof. In the charged particle beam device, for example, the brightness is adjusted by reference signal intensity of a detection signal (for example, an offset value of an amplifier provided at a rear stage of a detector), and the contrast is adjusted by an amplification factor of the detector.

Here, for example, in PTL 1, disclosed is a method of using a predetermined arithmetic formula or a table when an ABCC parameter is adjusted. However, for example, in a detector, various characteristic variations may occur depending on an individual difference thereof, deterioration over time thereof, and the like. In this case, in the method of using the arithmetic formula or the table, a highly accurate ABCC parameter value cannot be obtained. Accordingly, there is a possibility that a user is required to perform a separate operation such as fine-adjustment of the ABCC parameter value. As a result, the time required to adjust the ABCC parameter may increase.

The present invention has been made in consideration of the above-mentioned problems, and it is an object of the present invention to provide a measurement system and a method of setting a parameter of a charged particle beam device, with which the time required to adjust an ABCC parameter can be shortened.

The above-mentioned object, other objects, and novel features of the present invention will become apparent from the description and accompanying drawings in the specification.

Solution to Problem

A brief outline of a representative one of embodiments disclosed in this application will be described as follows.

A measurement system according to a representative embodiment of the present invention includes a charged particle beam device, a characteristic storage unit, and a verification device. The charged particle beam device includes a charged particle optical system configured to irradiate a sample with a charged particle beam, a detector configured to detect and amplify an electron emitted from the sample in response to irradiation of the charged particle beam, an image conversion unit configured to convert a signal from the detector into a captured image, and an ABCC control unit configured to receive an ABCC parameter and to set an amplification factor in the detector. The characteristic storage unit stores characteristic information of the detector in advance. The verification device includes a simulator input signal generation unit, a simulation detector, a simulated image conversion unit, and a parameter search unit. The simulator input signal generation unit generates a simulator input signal corresponding to the electron emitted from the sample. The simulation detector uses an arithmetic model that simulates an operation of the detector, and executes arithmetic processing on the simulator input signal in a state in which the characteristic information is reflected in an arithmetic parameter of the arithmetic model. The simulated image conversion unit executes arithmetic processing corresponding to the image conversion unit, and converts a signal from the simulation detector into a simulated image. The parameter search unit searches for an ABCC parameter with respect to the simulation detector so that an evaluation value obtained from the simulated image becomes a specified reference value, and outputs the ABCC parameter as a search result to the ABCC control unit.

Advantageous Effects of Invention

An effect, obtained by a representative embodiment in the present invention disclosed in this application, is briefly described as follows. A measurement system including a charged particle beam device can shorten the time required to adjust an ABCC parameter.

BRIEF DESCRIPTION OF DRAWINGS

FIG. 1 is schematic diagram showing a configuration example of a measurement system according to a first embodiment of the present invention.

FIG. 2 is a schematic diagram showing an outline of a method of adjusting an ABCC parameter.

FIG. 3 is a diagram showing a detailed configuration example of a main part of the measurement system in FIG. 1.

FIG. 5 is a flowchart showing an example of a method of setting a parameter of a charged particle beam device according to the first embodiment of the present invention.

FIG. 6 is a diagram showing a detailed configuration example of a main part of the measurement system in FIG. 1 in a measurement system according to a second embodiment of the present invention.

FIG. 7 is a diagram showing a detailed configuration example of a main part of the measurement system in FIG. 1 in a measurement system according to a third embodiment of the present invention.

FIG. 8 is a diagram showing an example of a setting screen displayed on a display unit in FIG. 7.

FIG. 9 is a flowchart showing an example of a method of setting a parameter of a charged particle beam device according to a fourth embodiment of the present invention.

FIG. 10 is a diagram showing an outline of a method of measuring a geometric length using a charged particle beam device.

FIG. 11 is a schematic diagram snowing a configuration example of a general charged particle beam device.

DESCRIPTION OF EMBODIMENTS

Figure 4A:
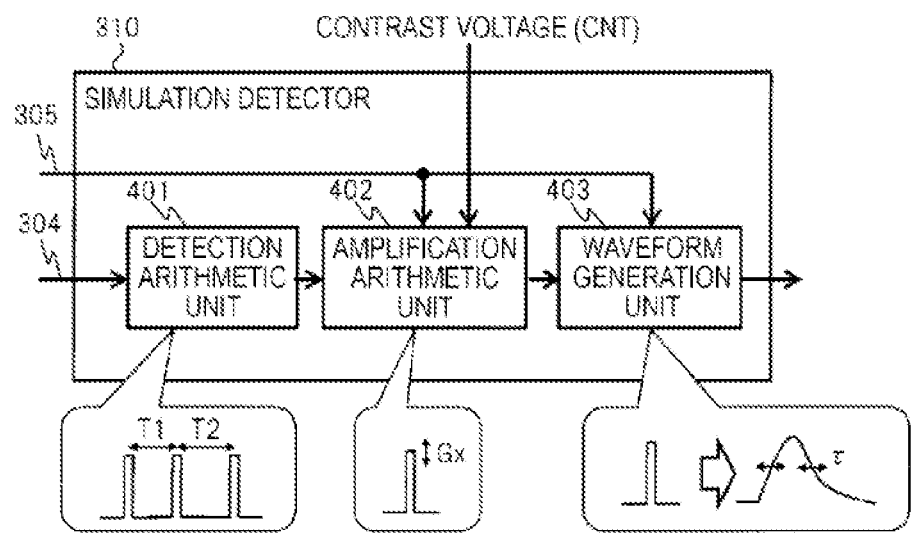
FIG. 4A is a diagram showing a configuration example and a schematic operation example of a simulation detector in a verification device in FIG. 3.

Hereinafter, embodiments of the present invention will be described in detail with reference to the drawings. In addition, in all the drawings showing the embodiments, the same members will be denoted by the same reference numerals in principle, and the repeated description thereof will be omitted.

Further, in the following embodiments, a scanning electron microscope (SEM) using an electron beam will be described as an example as a charged particle beam device, and the present invention is not limited thereto. The present invention can also be applied to other charged particle beam devices such as an ion microscope device using an ion beam.

First Embodiment

Configuration of Charged Particle Beam Device (Comparative Example)

First, prior to the description of a measurement system of a first embodiment, a configuration example of a general charged particle beam device and problems thereof will be described. FIG. 11 is a schematic diagram showing a configuration example of a general charged particle beam device. A charged particle beam device 10' shown in FIG. 11 includes a charged particle optical system 11 configured to irradiate a sample 105 with an electron beam (a charged particle beam) 103, a detector 108 configured to detect an electron emitted from the sample 105 in response to irradiation of the electron beam and to amplify the same, and a signal processing unit 12'. In this specification, the charged particle beam device is also referred to as an actual machine.

The charged particle optical system 11 has an electron gun (a charged particle gun) 102 installed therein and configured to take out the electron beam (the charged particle beam) 103. The electron beam 103 is converged by electronic lenses 104, and the sample 105 placed on a stage 106 is irradiated with the converged electron beam. Accordingly, the sample 105 emits a signal electron (for example, a secondary electron and a backscattered electron) 107 to the detector 108. The detector 108 is configured to take the signal electron 107 as an input, to detect and amplify the input, and to convert the same into an electric signal.

The signal processing unit 12' includes a signal input unit 109, an image conversion unit 110, an evaluation value calculation unit 111, an ABCC control unit 112, and an image display unit 113. The signal input unit 109 includes, for example, an amplification circuit, a filter circuit, and an analog-to-digital conversion circuit (abbreviated as an ADC circuit), and appropriately processes the signal output from the detector 108 to convert the same into a digital signal. The image conversion unit 110 converts the signal from the detector 108 obtained via the signal input unit 109 into a captured image by pixel integration, inter-frame arithmetic processing, and the like. The image display unit 113 displays the captured image.

Here, when an ABCC function is provided, the image conversion unit 110 generates an image histogram (in other words, a brightness distribution) showing a relationship between a display gradation value and the number of pixels. The evaluation value calculation unit 111 calculates an evaluation value based on this image histogram, and the ABCC control unit 112 adjusts an ABCC parameter based on the evaluation value.

FIG. 2 is a schematic diagram showing an outline of a method of adjusting the ABCC parameter. As shown in FIG. 2, the evaluation value calculation unit 111 calculates the maximum gradation value (a peak value) and the minimum gradation value (a bottom value) of the brightness in an image histogram 200, or a feature amount corresponding thereto as an evaluation value of the image histogram 200. As a specific example, the peak value and the bottom value are determined to be a gradation value in which the cumulative frequency of the image histogram 200 becomes 90% and gradation value in which the cumulative frequency thereof becomes 10%, respectively.

The ABCC control unit 112 adjusts the BCS parameter so that the peak value and the bottom value, which are the evaluation values of the image histogram 200, become specified reference values. In this example, each of the specified reference values is a gradation value corresponding to 80% of a full scale of the gradation value (for example, 256 gradations or the like) and a gradation value corresponding to 20% thereof. The ABCC control unit 112 adjusts the ABCC parameter so that the peak value becomes the gradation value corresponding to of the full scale and the bottom value becomes the gradation value corresponding to of the full scale. Accordingly, the brightness and contrast of the image are appropriately adjusted.

The ABCC parameter includes an offset voltage (brightness voltage) BRT for setting the bottom value to the gradation value corresponding to 20% of the full scale, and a contrast voltage CNT for setting the peak value to the gradation value corresponding to 80% of the full scale. For example, the offset voltage BRT is reflected in the bias of the amplification circuit provided in the signal input unit 109. The contrast voltage CNT is reflected in the amplification factor of the detector 108.

The image conversion unit the evaluation value calculation unit 111, and the ABCC control unit 112 are implemented by program processing using, for example, a CPU (Central Processing Unit), a GPU (Graphics Processing Unit), a DSP (Digital Signal Processor), and the like. However, the implementation form of each unit is not limited thereto. The same may be implemented by hardware such as FPGA (Field Programmable Gate Array), ASIC (Application Specific Integrated Circuit), and the like, or may be implemented by a combination of hardware and software.

Problems of Charged Particle Beam Device (Comparative Example)

Examples of a specific processing method of the ABCC control unit 112 in FIG. 2 include a method using a predetermined relational formula or a table representing a correlation between the evaluation value and the ABCC parameter. In this case, the ABCC control unit 112 refers to the relational formula or the table, thereby making it possible to acquire a value of the ABCC parameter, the value being required to determine an evaluation value from the evaluation value calculation unit 111 as a reference value.

Meanwhile, when a photomultiplier tube is used as the detector 108, various characteristic variations representing variations in the amplification factor may occur due to an individual difference thereof, deterioration over time thereof, and the like. In this case, even if the evaluation value is the same, the value of the ABCC parameter, required to determine the evaluation value as the reference value, is different for each device in the same model, and the value thereof changes after a certain period of use. Further, variations in amplification factor may also occur by probabilistic elements.

As result, in the case of the method using the fixed relational formula or the table, it may be difficult to determine the evaluation value as the reference value with high accuracy. Therefore, in the practical use, once the ABCC parameter is set, a user is required to finely adjust the value of the ABCC parameter while manually repeating the observation of the captured image of the actual machine and resetting of the ABCC parameter.

As described above, when the characteristic variations occur in the detector 108, it may take time to obtain an appropriate ABCC parameter value. As a result, particularly, when a measurement process using the charged particle beam device 10' is incorporated into a manufacturing process of a semiconductor device, throughput of the process may deteriorate.

Specifically, the appropriate ABCC parameter value usually varies depending on the type of sample 105 (that is, a degree difference of an uneven shape of each type). Therefore, in the measurement process, it is practically necessary to adjust the ABCC parameter every time the type of sample to be measured changes. In this case, when there are various characteristic variations in the detector 108 as described above, it is necessary for a user to finely adjust the ABCC parameter over a certain amount of time while manually repeating the observation of the captured image of the actual machine and the resetting of the ABCC parameter every time the type of sample changes.

Outline of Measurement System (First Embodiment)

Here, the measurement system of the first embodiment searches for an appropriate ABCC parameter on a simulator/emulator in the state in which various characteristic variations of the actual machine are reflected in a simulator/emulator model. FIG. 1 is a schematic diagram showing a configuration example of the measurement system according to the first embodiment of the present invention. The measurement system shown in FIG. 1 includes a charged particle beam device (an actual machine) 10 and a verification device 13. In addition to the charged particle optical system 11 and the detector 108 as in the case of FIG. 11, the charged particle beam device 10 includes a signal processing unit 12 slightly different from that in the case of FIG. 11.

The signal processing unit 12 is not provided with the evaluation value calculation unit 111 in comparison with the signal processing unit 12' in FIG. 11. The verification device 13 is formed of, for example, a calculator (a computer) including a CPU or the like, and allows the CPU or the like to execute a simulation program provided in the verification device 13, thereby searching for the ABCC parameter (that is, the offset voltage BRT and the contrast voltage CNT) AP. The ABCC control unit 112 in the actual machine 10 receives the ABCC parameter AP, which is a search result, as a digital value, sets the amplification factor to be an analog value in the detector 108, and sets a bias or the like to be an analog value in the signal input unit 109.

Details of Measurement System (First Embodiment)

FIG. 3 is a diagram showing a detailed configuration example of a main part of the measurement system in FIG. 1. In FIG. 3, the verification device 13 includes an inverse conversion processing unit 303 and a verification model 306. The verification model 306 includes a simulation detector 310, a simulation signal input unit 311, a simulated image conversion unit 312, an evaluation value calculation unit 313, and an ABCC search unit (a parameter search unit) 314, which are configured by allowing a CPU or the like to execute a simulation program set in a calculator. Accordingly, the verification model 306 roughly simulates the processing of the detector 108 and the signal input unit 109 in the actual machine 10 using the simulation detector 310 and the simulation signal input unit 311, and searches for the ABCC parameter AP with respect to the simulation detector 310 and the simulation signal input unit 311. The operation of each of these units will be described below.

First, in the actual machine 10, an image of the predetermined sample 105 is captured once using the predetermined ABCC parameter AP. The inverse conversion processing unit (a simulator input signal generation unit) 303 stores a captured image 302 in a storage device (HDD (Hard Disk Drive) and SSD (Solid State Drive)) in the verification device 13, and generates a secondary electronic signal or the like estimated to be input to the detector 108 in the actual machine 10 as a simulator input signal 304 based on the captured image 302. In other words, the inverse conversion processing unit 303 converts the captured image 302 into the input of the detector 108 in FIG. 1 (the signal electron 107).

In this case, the inverse conversion processing unit 303 first generates a secondary electronic profile corresponding to the captured image 302 using a generally known method. In the secondary electronic profile, a vertical axis thereof defines an amount of generated secondary electrons, and a horizontal axis thereof defines an X-axis direction of the captured image 302. The secondary electronic profile is formed by plotting the amount of secondary electrons generated when an electron beam (a primary electron) is scanned and irradiated.

The inverse conversion processing unit 303 performs inverse arithmetic on a signal processing process performed by the detector 108 and the signal in unit 109 in the actual machine 10 (an amplification process of the detector 108, a conversion process from a secondary electron to an electric signal, an amplification process of the signal input unit 109, and the like) with respect to the secondary electronic profile, and generates the simulator input signal 304. The details of the signal processing process of the detector 108 and the signal input unit 109 will be described later.

Further, for example, the actual machine 10 includes a characteristic storage unit 301 having characteristic information 305 of the detector 108 stored therein in advance. The characteristic information 305 is information indicating an amplification factor (that is, a gain characteristic between the number of received secondary electrons and an output signal), a rising/falling characteristic of an output waveform (an output signal), and the like in the actual detector 108, and is information indicating an individual difference of the detector 108, deterioration over time thereof, and the like. The characteristic information 305 is extracted, for example, by performing a verification experiment on the actual machine 10 at the initial installation stage or every time a predetermined usage period elapses, and stored in the characteristic storage unit 301. For example, the characteristic storage unit 301 is stored in a storage device such as a ROM (Read Only Memory) mounted in the actual machine 10. Alternatively, the same may be stored in a storage device provided outside the actual machine 10.

Figure 4B:
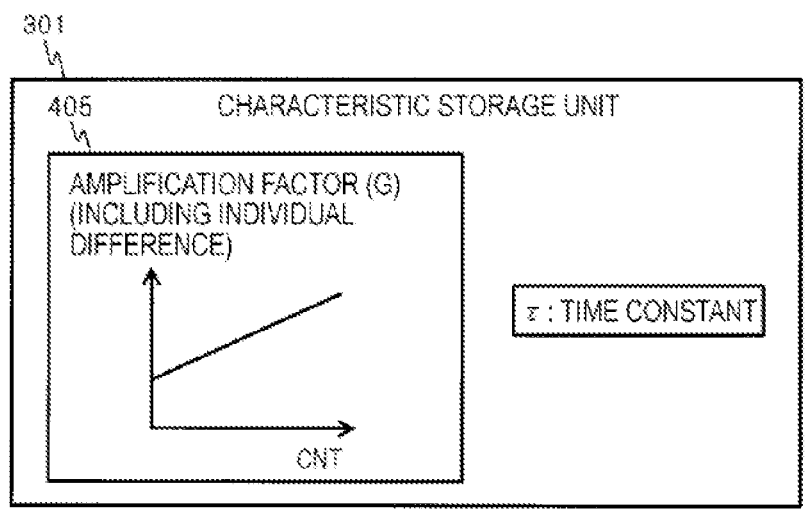
FIG. 4B is a diagram showing an example of characteristic information stored in a characteristic storage unit in FIG. 3.

The simulator input signal 304 and the characteristic information 305 are input to the verification model 306. FIG. 4A is a diagram showing a configuration example and a schematic operation example of the simulation detector in the verification device in FIG. 3, and FIG. 4B is a diagram showing an example of characteristic information stored in the characteristic storage unit in FIG. 3.

The simulation detector 310 shown in FIG. 4A uses an arithmetic model that simulates the operation of the detector 108 in the actual machine 10, and executes arithmetic processing on the simulator input signal 304 in the state in which the characteristic information 305 is reflected in an arithmetic parameter of the arithmetic model. The simulation detector 310 includes a detection arithmetic unit 401, an amplification arithmetic unit 402, and a waveform generation unit 403 as arithmetic models.

Here, the detector 108 in the actual machine 10 converts the input secondary electron into a photon, further converts the photon into a photoelectron, and amplifies the converted photoelectron to output the same as an electric signal. In this case, even if the input secondary electron is kept constant, the input of the secondary electron has a probability distribution. The detection arithmetic unit 401 is configured to model the process of converting a secondary electron into a photon and further converting the photon into a photoelectron, and to generate a rectangular wave pulse signal at a generation interval based on the simulator input signal 304.

Specifically, in the conversion process in the actual defector 108, the number of photoelectrons generated during the unit time is represented by a Poisson distribution having "$\lambda$" as an average value, and an event occurrence interval is represented by an exponential distribution having "$1/\lambda$" as an average value. Reflecting this, the detection arithmetic unit 401 sets the level of the simulator input signal 304 to "$\lambda$", and disperses the generation interval of the rectangular wave pulse signal with the exponential distribution having "$1/\lambda$" as the average value. That is, an FIG. 4A, the average value of periods T1, T2, and the like dispersed by the exponential distribution is determined to be "$1/\lambda$". A pulse width of the rectangular wave pulse signal is fixed to, for example, 1 ns.

The amplification arithmetic unit 402 receives the contrast voltage CNT, which is one the ABCC parameters, and the characteristic information 305 from the characteristic storage unit 301, and amplifies an amplitude of the rectangular wave pulse signal from the detection arithmetic unit 401 with an amplification factor Gx. Here, in the detector 108 provided in the actual machine 10, a probabilistic distribution occurs in the amplification factor even in the amplification process of photoelectrons. For example, when the amplification factor of the detector 108 is set to G, one photoelectron may eventually become G pieces of electrons or "G+1" pieces of electrons. Reflecting this, the amplification arithmetic unit 402 represents the output with the Poisson distribution in which "m×G" becomes the average value when the input from the detection arithmetic unit 401 is set to m.

For example, in the case in which the detector 108 performs amplification in an n-stage configuration, reflecting this, for example, the amplification arithmetic unit 402 represents an output a of a first stage as "a=m+Poisson (m×G/n)" with "Poisson ($\lambda$)" as a random number of Poisson distribution having "$\lambda$" as the average value, and represents an output b of a second stage as "b=a+Poisson (a×G/n)". Further, the amplification factor G of the detector 108 at this time may chance due to an individual difference thereof, deterioration over time thereof, and the like. Here, the amplification arithmetic unit 402 determines the amplification factor G based on the characteristic information 305 stored in the characteristic storage unit 301.

Specifically, as shown in FIG. 4B, the characteristic information 305 includes correlation information 405 showing an actual correlation between the value of the ABCC parameter (specifically, the contrast voltage CNT) and the amplification factor G in the detector 108. The amplification arithmetic unit 402 acquires the amplification factor C corresponding to the input contrast voltage CNT based on the correlation information 405. Then, on the assumption that the acquired amplification factor G varies in the Poisson distribution as described above, the amplification arithmetic unit 402 amplifies the amplitude of the rectangular wave pulse signal from the detection arithmetic unit 401 with the amplification factor Gx that reflects a variation based on the correlation information 405 and a variation based on the Poisson distribution.

In this manner, from an output of an n-th stage of the amplification arithmetic unit 402, the amplitude varies based on the amplification factor Gx, the pulse width is minute (for example, 1 ns), and a time-series rectangular wave pulse signal, in which an event occurrence interval becomes the exponential distribution, is generated. That is, by us in the detection arithmetic unit 401 and the amplification arithmetic unit 402, it is possible to generate rectangular wave pulse signal reflecting various probability variations and individual difference variations in the amplification factor G that may occur in the detector 108 in the actual machine 10. In other words, the detector 108 in the actual machine 10 can be modeled with high accuracy.

As shown in FIG. 4A, the waveform generation unit 403 generates an output waveform (an output signal of the simulation detector 310) by changing the rising time and falling time of the rectangular wave pulse signal from the amplification arithmetic unit 402 based on time constant $\tau$. In this case, in the detector 108 provided in the actual machine 10, characteristic variations may occur in a rising characteristic cared a falling characteristic of the output waveform due to an individual difference thereof, deterioration over time thereof, and the like.

Here, as shown in FIG. 4B, the characteristic information 305 stored in the characteristic storage unit 301 includes the time constant $\tau$ that represents the rising characteristic and the falling characteristic of the actual output waveform of the detector 108. The time constant $\tau$ is extracted by performing a verification experiment on the actual machine 10 in advance, as in the case of the correlation information 405.

The waveform generation unit 403 generates the output waveform by reflecting the time constant τ. As a result, the detector 108 in the actual machine 10 can be modeled with higher accuracy.

The waveform generation unit 403 can modeled by a transfer function model or an electronic circuit model, and for example, when the same is modeled by an electronic circuit, an RC circuit or the like can be used. Since the RC circuit has the time constant τ obtained by "R (a resistance value)×C (a capacity value)", the waveform generation unit 403 may set a RC parameter of the RC circuit based on the time constant τ included in the characteristic information 305. In the rectangular wave response of the RC circuit, the time constant τ is the time from the minimum value, to "−1/e (e: Napier's constant)" times the maximum value, or the time from the maximum value to 1/e times the maximum value.

In FIG. 3, the output electric signal generated by the simulation detector 310 is input to the simulation signal input unit 311. The simulation signal input unit 311 performs various arithmetic processing on the input output electric signal using an arithmetic model that simulates the operation of the signal input unit 109 in the actual machine 10. Specifically, the simulation signal input unit 311 performs the arithmetic processing using electronic circuit models corresponding to an amplification circuit, a filter circuit, and an ADC circuit in the signal input unit 109, respectively. In this case, the electronic circuit model corresponding to the amplification circuit performs the arithmetic processing by reflecting the value of the ABCC parameter (specifically, the offset voltage BRT).

In addition, each electronic circuit model of the simulation signal input unit 311 may reflect the characteristic variations (the individual difference) of each circuit in the signal input unit 109 provided in the actual machine 10, the characteristic variations being extracted in advance in the verification experiment. Examples of the characteristic variations include a variation in a resistance value of a resistance element forming the amplification circuit, a variation in a frequency characteristic of the amplification circuit and the filter circuit, and the like. Alternatively, a method may be used, in which the characteristic of each circuit extracted in the verification experiment is stored in the characteristic storage unit 301 and reflected in the simulation signal input unit 311 as in the case of the simulation detector 310.

The simulated image conversion unit 312 is configured to execute the arithmetic processing corresponding to the image conversion unit 110 in the actual machine 10, to receive a signal from the simulation detector 310 via the simulation signal input unit 311, and to convert the signal into a simulated image. Further, the simulated image conversion unit 312 generates, for example, the image histogram 200 of the simulated image. The evaluation value calculation unit 313 calculates an evaluation value (for example, a peak value, a bottom value, and the like) of the simulated image from the simulated image conversion unit 312 (specifically, the image histogram 200), the evaluation value being same as in the case of the evaluation value calculation unit 111 shown in FIG. 11.

The ABCC search unit (the parameter search unit) 314 searches for the ABCC parameter (the contrast voltage CNT) with respect to the simulation detector 310 and the ABCC parameter (the offset voltage BR T) with respect to the simulation signal input unit 311 so that the evaluation value obtained from the simulated image becomes the specified reference value. Next, the ABCC search unit 314 outputs the ABCC parameter AP, which is a search result, to the ABCC control unit 112 in the actual machine 10.

As a result, as in the case of FIG. 2, the ABCC search unit 314 can obtain, for example, the ABCC parameter AP configured to match the peal value (90% of cumulative frequency)/the bottom value (10% of cumulative frequency) in the image histogram 200 of the simulated image to the gradation value of 80% of the full scale/the gradation value of 20% thereof, respectively. The ABCC control unit 112 in the actual machine 10 receives the contrast voltage CNT in the ABCC parameter AP to set the amplification factor in the detector 108, and receives the offset voltage BRT in the ABCC parameter AP to set a bias or the like in the signal input unit 109.

The ABCC search unit 314 may determine the ABCC parameter (BRT/CNT) as an initial value at the time of performing the search, and may perform the search while appropriately changing the ABCC parameter from the initial value. As the initial value at this time, for example, a value of a predetermined ABCC parameter used by the ABCC control unit 112 when the captured image 302 is first acquired by the actual machine 10 may be used. In this case, the verification device 13 in FIG. 3 obtains the image histogram 200 by inputting the candidate ABCC parameter generated based on the predetermined ABCC parameter and the simulator input signal 304 to the verification model 305 (that is, the simulation program), and corrects the candidate ABCC parameter AP based on the image histogram 200.

Further, the ABCC search unit 314 may set a plurality of initial values at the time of performing the search, and may search for the ABCC parameter by parallel processing using the plurality of initial values. Additionally, when the ABCC parameter is changed, a method of a full search algorithm or a method of changing the ABCC parameter with any combination may be used.

Further, as described above, the inverse conversion processing unit (the simulator input signal generation unit) 303 in FIG. 3 executes processing of performing inverse arithmetic of the signal processing process performed by the detector 108 and the signal input unit 109 with respect to the secondary electronic profile. Specifically, the inverse conversion processing unit 303 converts the secondary electronic profile using an electronic circuit model configured to perform the inverse conversion of the electronic circuit model used in the simulation signal input unit 311. Here, the inverse conversion processing unit 303 may further execute processing of performing the inverse arithmetic of various arithmetic processing shown in FIG. 4A and FIG. 4B (for example, pulsing, averaging the Poisson distribution, and averaging the exponential distribution) the converted signal.

Method of Setting Parameter of Charged Particle Beam Device (First Embodiment)

FIG. 5 is a flowchart showing an example of a method of setting a parameter of the charged particle beam device according to the first embodiment of the present invention. In FIG. 5, first, the charged particle beam device (the actual machine) 10 acquires the captured image 302 by capturing an image of the sample 105 to be captured in advance using a predetermined ABCC parameter (step S101). The verification device 13 (the inverse conversion processing unit 30) generates the simulator input signal 304 based on the captured image 302 (step S201).

Next, the verification device 13 reflects the characteristic information 305 stored in the characteristic storage unit 301 in an arithmetic model in the verification model 305 (step S202). In the state in which the characteristic information 305 reflected therein as described above, the verification device 13 searches for the ABCC parameter using the ABCC search unit 314 and the like so that an evaluation value becomes a reference value in steps S203 to S206.

Specifically, the ABCC search unit 314 sets the ABCC parameter to a predetermined initial value (step S203). The predetermined initial value may be, for example, the predetermined ABCC parameter used in step S101. The simulated image conversion unit 312 generates the image histogram 200 of a simulated image obtained based on the current ABCC parameter (step S204). Further, the evaluation value calculation unit 313 calculates the evaluation value from the image histogram 200. Then, the ABCC search unit 314 determines whether or not the evaluation value obtained from the image histogram 200 matches the specified reference value (step S205). When the evaluation value does not match the reference value (step S205: NO), in step S206, the ABCC search unit 314 changes (in other words, corrects) the ABCC parameter (the candidate ABCC parameter) and returns to step S204 to repeat the same processing.

On the other hand, when the evaluation value matches the reference value (step S205: YES), the processing transitions to step S102. In step S102, the ABCC control unit 112 in the actual machine 10 receives the ABCC parameter when the evaluation value matches the reference value from the verification device 13, and sets the ABCC parameter in the detector 108 and the signal input unit 109. Then, the actual machine 10 captures the image of the sample 105 to be captured based on the ABCC parameter (step S103).

Accordingly, for example, even when the brightness and contrast in the captured image 302 acquired in step S101 are not appropriate, the brightness and the contrast of the captured image acquired in step S103 are appropriately adjusted.

Although the evaluation value calculation unit 111 in FIG. 11 is deleted in the actual machine 10 in FIGS. 1 and 3, the actual machine 10 may include the same evaluation value calculation unit 111 as in the case of FIG. 11. In this case, in the same manner as in the case of FIG. 11, in addition to the function of receiving the evaluation value from the evaluation value calculation unit 111 and determining the ABCC parameter, as shown in FIGS. 1 and 3, the ABCC control unit 112 has a function of receiving the input of the ABCC parameter AP from the verification device 13. Here, for example, the ABCC control unit 112 may determine the ABCC parameter based on the table or the like in step S101 (image capturing in advance) of FIG. 5, and may receive the input of the ABCC parameter AP from the verification device 13 in step S103 (subsequent image capturing).

As described above, the detector 108 in the actual machine 10 in FIG. 3 is formed of a photomultiplier tube or the like, the signal input unit 109 is formed of a dedicated circuit including an amplification circuit or the like, and the characteristic storage unit 301 is formed of a predetermined storage device (a ROM or the like). The image conversion unit 110 and the ABCC control unit 112 in the actual machine 10 are typically mounted in a calculator (a computer) including a CPU or the like, and are implemented by program processing using the CPU or the like. However, depending on cases, a part or all of the image conversion unit 110 and the ABCS control unit 112 can be implemented by hardware such as FPGA and ASIC. The image display unit 113 is formed of a liquid crystal display or the like.

Further, the verification device 13 in FIG. 3 is typically formed of a calculator (a computer) including a CPU or the like. The inverse conversion processing unit (the simulator input signal generation unit) 303, the simulation detector 310, the simulation signal input unit 311, the simulated image conversion unit 312, the evaluation value calculation unit 313, and the ABCC search unit (the parameter search unit) 314, which are provided in the verification device 13, are implemented by program processing using a CPU or the like. However, depending on cases, it is also possible to implement some of the components in the verification device 13 with hardware such as FPGA and ASIC. For example, when the image conversion unit 110 in the actual machine 10 is configured with dedicated hardware, it is also possible to use the dedicated hardware as it is as the simulated image conversion unit 312.

Further, the verification device 13 in FIG. 3 can be configured by using, for example, a calculator forming the image conversion unit 110 or the like in the actual machine 10. That is, the image conversion unit 110 and the ABCC control unit 112 in the actual machine 10 and the verification device 13 may be configured as one calculator. In this case, a simulation program corresponding to the verification device 13 may be set (in other words, installed or stored in a memory read by a CPU or the like) in the calculator provided in the actual machine 10.

Main Effect of First Embodiment

As described above, by using the method of the first embodiment, typically, it is possible to shorten the time required to adjust the ABCC parameter even when various characteristic variations occur in the charged particle device. Accordingly, when a measurement process using the charged particle beam device is incorporated into a manufacturing process or the like of a semiconductor device, it is possible to improve the throughput of the process. Further, it is possible to reduce the workload of a user.

As a specific example, when a configuration as shown in FIG. 11 is used, for example, after step S101 in FIG. 5, a user is required to manually repeat the observation of the captured image of the actual machine and the resetting of the ABCC parameter. Here, the user needs to repeatedly perform the above-described operation every time the type of the sample 105 to be captured changes. Meanwhile, when the method of the first embodiment is used, for example, image-capturing (step S101) is performed in advance once every time the type of the sample 105 changes. Thereafter, the verification device 13 instead of the user can automatically and repeatedly perform the above-described operation at high speed.

Second Embodiment

Details of Measurement System (Second Embodiment)

FIG. 6 is a diagram showing a detailed configuration example of a main part of the measurement system in FIG. 1 in a measurement system according to a second embodiment of the present invention. In FIG. 6, as compared with the configuration example in FIG. 3, a signal generation unit (a simulator input signal generation unit) 602 is provided in a verification device 13a instead of the inverse conversion processing unit 303. The signal generation unit (the simulator input signal generation unit) 602 is configured to be implemented by, for example, program processing using a CPU or the like, and to generate the simulator input signal 304 based on design data 601 of the sample 105.

That is, when design information (for example, the size and arrangement thereof) of the sample 105 to be captured by the charged particle beam device is known in advance, the simulator input signal 304 can be uniquely generated from the design data 601. Specifically, for example, a correspondence relationship between pixel coordinates P=(p,q) on the captured image and coordinates X=(x,y) on the sample is predetermined based on various image-capturing conditions such as magnification.

Additionally, height information of the unevenness of the sample can be allocated to each position X on the sample based on the design data 601 of the sample shape (CAD data or the like). A relationship between sample information (a sample material and a height) and the secondary electron 107 with respect to the electron beam 103 can be determined by performing an experiment in advance. Alternatively, the same can be predetermined as an arithmetic formula or a table by performing an electron beam scattering simulation. As a result, the signal generation unit 602 can calculate the secondary electron 107 at each coordinate based on the design data 601 of the sample 105, thereby making it possible to generate the simulator input signal 304.

Main Effect of Second Embodiment

As described above, by using the method of the second embodiment, it is possible to further improve the throughput in addition to the various effects described in the first embodiment. Specifically, for example, in FIG. 5 shown above, the processing of step S101 (image-capturing in advance) becomes unnecessary. Further, the variations in the ABCC parameter, which is the search result, are eliminated, and as a result, the accuracy of the ABCC parameter may be further improved.

More specifically, for example, the captured image 302 acquired in step S101 (image-capturing in advance) of FIG. 5 may have a variation component superimposed on a certain average value, such as a randomly fluctuating noise component. In this case, for example, the search result of the ABCC parameter also changes randomly depending on the captured image 302 that can change randomly, and a width of this change can be a setting error of the ABCC parameter. On the other hand, in the method of the second embodiment, conceptually, the search result of the ABCC parameter can be obtained based on the average value excluding this variation component without depending on the captured image 302. Accordingly, reproducibility of the search result is guaranteed, thereby making it possible to reduce the width of the setting error of the ABCC parameter.

Third Embodiment

Details of Measurement System (Third Embodiment)

FIG. 7 is a diagram showing a detailed configuration example of a main part of the measurement system in FIG. 1 in a measurement system according to a third embodiment of the present invention. In FIG. 7, a display unit 701, an operation unit 702, and a display control unit 703 are added in a verification device 13b as compared with the configuration example of FIG. 3. Accordingly, the operation of an evaluation value calculation unit 313b in the verification device 13b is slightly different.

The display unit 701 is a liquid crystal display or the like. The operation unit 702 is a keyboard, a mouse, or the like, and receives an input from a user. The display control unit 703 is implemented by program processing using a CPU or the like, and the display unit 701 displays a setting screen (a GUI (Graphical User Interface) screen) on which the user can set a search condition associated with the search for the AECC parameter. The evaluation value calculation unit 313b calculates the evaluation value based on the search condition set by the user.

FIG. 8 is a diagram showing an example of the setting screen displayed on the display unit in FIG. 7. In FIG. 8, when a user selects automatic setting on the setting screen via the operation unit 702, the search condition of the ABCC parameter is automatically set. Specifically, for example, the bottom value and the peak value, which are the evaluation values of the image histogram 200, are determined to be gradation values corresponding to 10% of the cumulative frequency and 90% thereof, respectively.

On the other hand, instead of selecting the automatic setting, a user can freely and selectively set, via the operation unit 702, what percentage of the cumulative frequency each of the bottom value and the peak value which are the evaluation values corresponds to. In this case, the evaluation value calculation unit 313b calculates the bottom value and the peak value, which are the evaluation values of the image histogram 200, respectively, based on the setting from the user.

Further, a user can select parallel execution on the setting screen via the operation unit 702. When the parallel execution is selected, the ABCC search unit (the parameter search unit) 314 sets a plurality of initial values associated with the search for the ABCC parameter, and searches for the ABCC parameter by parallel processing using the plurality of initial values. As a specific method, for example, at least of a plurality of sets of the simulation detector 310, the simulation signal input unit 311, and the simulated image conversion unit 312 in FIG. 7 are provided to set a different initial value for each of the sets thereof, and searching is performed in parallel using each of the sets thereof. By using such parallel processing, the time required to search for the ABCC parameter can be further shortened. The user may determine, for example, whether to perform the parallel execution depending on arithmetic performance of the verification device 13b.

After completing the various settings as described above, the user inputs an ABCC execution button. In response thereto, the measurement system starts, for example, the processing flow in FIG. 5. Additionally, as shown in FIG. 8, the display unit 701 in FIG. 7 may appropriately display the image histogram 200, the search result of the ABCC parameter, and the like. Although the configuration example in FIG. 3 is assumed here, of course, the configuration example in FIG. 6 may be assumed.

Main Effect of Third Embodiment

As described above, by using the method of the third embodiment, in addition to the various effects described in the first and second embodiments, the search for the ABCC parameter is executed in the parallel processing, thereby making it possible to shorten the time required to adjust the ABCC parameter. In addition, the user can change the search condition as necessary, and as such, the convenience of the user can be improved.

Fourth Embodiment

Method of Setting Parameter of Charged Particle Beam Device (Fourth Embodiment)

FIG. 9 is a flowchart showing an example of a method of setting a parameter of a charged particle beam device according to a fourth embodiment of the present invention. FIG. 10 is a diagram showing an outline of a method of measuring a geometric length using the charged particle beam device. In the fourth embodiment, the measurement system as shown in FIGS. 1 and 3 is used.

First, for example, as shown in FIG. 10, when the charged particle beam device is used to capture an image of a reference sample 1001 having a known geometric length (dimension) L, a secondary electronic profile 1002 corresponding to the geometric length L (and a corresponding captured image) is generated. By analyzing the secondary electronic profile 1002 (or the captured image), the geometric length can be measured.

However, in this analysis, when an offset level 1003 and an amplitude level 1004 of the secondary electronic profile 1002 change due to the characteristic variations in the device, an error may be generated in the geometric length L which is a measurement result between devices. Therefore, practically, the error of the measurement result between the devices may be compensated by the ABCC parameter. FIG. 9 shows a flowchart used in this case.

First, in step S301 of FIG. 9, a charged particle beam device 10a acquires a captured image 901 of the reference sample 1001 having the known geometric length L in the state in which the ABCC parameter is adjusted so that a geometric length (Ld) measured from the captured image 901 becomes the known geometric length L (in other words, a reference value). The charged particle beam device 10a serves as a reference device.

Next, as in the case of FIG. 5, the verification device 13 generates the simulator input signal 304 based on the captured image 901 acquired by the reference device (10a) (step S201). Next, the verification device 13 reflects the characteristic information 305 stored in the characteristic storage unit 301 of a charged particle beam device 10b in the arithmetic model provided in the verification model 306 (step S202). The charged particle beam device 10b serves as a target device.

In this manner, in the state in which the captured image 901 from the reference device (10a) is input and the characteristic information 305 of the target device (10b) is reflected, in steps S203, S404, S205, and S206, the verification device 13 searches for the ABCC parameter using the ABCC search unit 314 or the like so that an evaluation value becomes a reference value. The search method at this time is almost the sane as that in steps S203 to S206 of FIG. 5, but the contents of the evaluation value and the reference value are different from those in the case of FIG. 5. That is, step S404 is executed instead of step S204 of FIG. 5.

In step S404, the verification device 13 (the evaluation value calculation unit 313) measures a geometric length from the simulated image by the simulated image conversion unit 312. In response thereto, the verification device 13 (the ABCC search unit 314) determines whether or not the evaluation value matches the reference value by defining the measured geometric length as the evaluation value and by defining the known geometric length L as the reference value (Step S205). Then, when the evaluation value matches the reference value (step S205: YES), in step S102, the ABCC control unit 112 of the target device (10b) receives the ABCC parameter which is a search result from the verification device 13, and sets the same in the detector 108 and the signal input unit 109.

Accordingly, the reference device (10a) and the target device (10b) can obtain the measurement result of the same geometric length with respect to the same captured image 901. In this case, in a general method, a user is required to manually repeat the image-capturing of the reference sample 1001 and the resetting of the ABCC parameter in the target device (10b). On the other hand, in the method of the fourth embodiment, the above-described operation including the image-capturing of the reference sample 1001 becomes unnecessary.

Main Effect of Fourth Embodiment

As described above, by using the method of the fourth embodiment, it is not necessary for a user to manually repeat the image-capturing and the resetting of the ABCC parameter in the target device (10b). As a result, it is possible to shorten the time required to adjust the ABCC parameter as in the case of the first embodiment.

Additional Remark

An example of the characteristic of each of the above-described embodiments is described as follows.

[1] A method of determining an ABCC parameter of charged particle beam device, the method including:
  setting a simulation program that simulates processing of a detector (108) and a signal input unit (109) of a charged particle beam device (10, 10b) using an ABCC parameter (AP) and characteristic information (305) indicating an individual difference of the charged particle beam device (10, 10b),
  storing a captured image (302) of a sample (105), the image of which is captured by a predetermined ABCC parameter,
  converting the captured image (302) into an input of the detector (108),
  obtaining an image histogram (200) by inputting the candidate ABCC parameter (AP) generated based on the predetermined ABCC parameter and the input of the detector (108) into the simulation program, and
  correcting the candidate ABCC parameter (AP) based on the image histogram (200).

[2] In the method according to [1],
  each of the detector (108) and the signal input unit (109) has an individual difference,
  the captured image (302) is an image in which a geometric length and an image of a reference sample (1001) are measured by another charged particle beam device (10a),
  the candidate ABCC parameter (AP) and the input of the detector (108) are provided to the simulation program to obtain a simulated image, and
  the candidate ABCC parameter (AP) is corrected based on a difference between a geometric length calculated by the simulated image and a geometric length obtained by the another charged particle beam device.

[3] In the method according to [1],
  the simulation program uses a gain characteristic between the number of received secondary electrons and an output signal of the detector (108), and a rising characteristic and a falling characteristic of the output signal as the characteristic information (305) of the detector (108).

[4] A measurement system including a charged particle beam device (10, 10b) and a verification device (13), the charged particle beam device (10, 10b) including a signal input unit (109), an ABCC control unit (112) a charged particle gun (102), a stage (106) on which a sample (105) is placed, and a detector (108), wherein the verification device (13) is configured:

to use an ABCC parameter and characteristic information (305) indicating an individual difference of the charged particle beam device (10, 10b), thereby having a simulation program that simulates the processing of the detector (108) and the signal input unit (109), to store a captured image (302) of the sample (105), the image of which is captured by a predetermined ABCC parameter, to convert the captured image (302) into an input of the detector (108), to input a candidate ABCC parameter (AP) generated based on the predetermined ABCC parameter and the input of the detector (108) into the simulation program, thereby obtaining an image histogram (200), and to correct the candidate ABCC parameter (AP) based on the image histogram (200).

[5] A verification device (13) that determines an ABCC parameter of a charged particle beam device, the verification device (13) being configured:

to use an ABCC parameter (AP) and characteristic information (305) indicating an individual difference of the charged particle beam device (10, 10b), thereby having a simulation program that simulates the processing of the detector (108) and the signal input unit (109) of the charged particle beam device (10, 10b), to store a captured image (302) of a sample (10), the image of which is captured by a predetermined ABCC parameter, to convert the captured image (302) into an input of the detector (108), to input a candidate ABCC parameter (AP) generated based on the predetermined ABCC parameter and the input of the detector (108) into the simulation program, thereby obtaining an image histogram (200), and to correct the candidate ABCC parameter (AP) based on the image histogram (200).

The present invention is not limited to the above-described embodiments, and includes various modifications. For example, the above-described embodiments have been described in detail in order to describe the present invention in an easy-to-understand manner, and are not necessarily limited to those having all the configurations described herein.

Further, it is possible to replace a part of the configuration of one embodiment with a configuration of another embodiment. It is also possible to add the configuration of another embodiment to the configuration of one embodiment. Additionally, it is possible to add, delete, or replace another configuration with respect to a part of the configuration of each embodiment.

In addition, a control line and an information line indicate what is considered necessary for the description, and do not necessarily indicate all the control lines and information lines on the product. Practically, it may be considered that almost all configurations are connected to each other.

Further, the above-mentioned simulation program can be stored in a recording medium readable by a computer, and then the same can be supplied to the computer. Examples of the recording medium include a magnetic recording medium such as a hard disk drive, an optical recording medium such as a DVD (Digital Versatile Disc) and a Blu-ray Disc, and a semiconductor memory such as a flash memory. Additionally, the above-mentioned simulation program can be supplied from a wiring server through a telecommunications line.

REFERENCE SIGNS LIST

10: charged particle beam device (actual machine)
11: charged particle optical system
13: verification device
105: sample
108: detector
110: image conversion unit
112: ABCC control unit
200: image histogram
301: characteristic storage unit
302: captured image
303: inverse conversion processing unit (simulator input signal generation unit)
304: simulator input signal
305: characteristic information
310: simulation detector
312: simulated image conversion unit
314: ABCC search unit (parameter search unit)
401: detection arithmetic unit
402: amplification arithmetic unit
403: waveform generation unit
405: correlation information
602: signal generation unit (simulator input signal generation unit)
701: display unit
702: operation unit
703: display control unit
901: captured image
1001: reference sample
AP: ABCC parameter
BRT: offset voltage (brightness voltage)
CNT: contrast voltage
τ: time constant

The invention claimed is:

1. A measurement system comprising:
a charged particle beam device including a charged particle optical system configured to irradiate a sample with a charged particle beam, a detector configured to detect and amplify an electron emitted from the sample in response to irradiation of the charged particle beam, an image conversion unit configured to convert a signal from the detector into a captured image, and an ABCC control unit configured to receive an ABCC (Auto Brightness Contrast Control) parameter and to set an amplification factor in the detector;
a characteristic storage unit configured to store characteristic Information of the detector in advance; and
a verification devices, wherein the verification device includes:
a simulator input signal generation unit configured to generate a simulator input signal corresponding to the electron emitted from the sample,
a simulation detector configured to use an arithmetic model that simulates an operation of the detector, and to execute arithmetic processing on the simulator input signal in a state in which the characteristic information is reflected in an arithmetic parameter of the arithmetic model,
a simulated image conversion unit configured to execute arithmetic processing corresponding to the image conversion unit, and to convert a signal from the simulation detector into a simulated image, and
a parameter search unit configured to search for an ABCC parameter for the simulation detector so that an evaluation value obtained from the simulated image becomes a specified reference value, and to output the ABCC parameter as a search result to the ABCC control unit.

2. The measurement system according to claim 1, wherein:

the characteristic information includes correlation information representing an actual correlation between a value of the ABCC parameter and the amplification factor in the detector, and the simulation detector includes:

a detection arithmetic unit configured to generate a pulse signal at a generation interval based on the simulator input signal, and an amplification arithmetic unit configured to acquire the amplification factor corresponding to the ABCC parameter based on the correlation information in accordance with the search in the parameter search unit, and to amplify an amplitude of the pulse signal from the detection arithmetic unit on the assumption that the acquired amplification factor varies in a Poisson distribution.

3. The measurement system according to claim 2, wherein:

the characteristic information includes a time constant representing a rising characteristic and a falling characteristic in an output waveform of the detector, and the simulation detector further includes a waveform generation unit configured to change rising time and falling time of the pulse signal from the amplification arithmetic unit based on the time constant.

4. The measurement system according to claim 2, wherein the detection arithmetic unit sets a level of the simulator input signal to "λ", and disperses the generation interval by an exponential distribution having "1/λ" as an average value.

5. The measurement system according to claim 1, wherein the simulator input signal generation unit generates the simulator input signal based on the captured image obtained from the charged particle beam device.

6. The measurement system according to claim 1, wherein the simulator input signal generation unit generates the simulator input signal based on design data of the sample.

7. The measurement system according to claim 1, wherein the verification device further includes:

an operation unit configured to receive an input from a user, a display unit, and a display control unit configured to allow the display unit to display a setting screen, the setting screen enabling the user to set a search condition associated with the search for the ABCC parameter.

8. The measurement system according to claim 1, wherein the parameter search unit sets a plurality of initial values associated with the search for the ABCC parameter, and searches for the ABCC parameter by parallel processing using the plurality of initial values.

9. The measurement system according to claim 1, wherein:

the evaluation value is a gradation value determined based on cumulative frequency of an image histogram obtained from the simulated image, and the reference value is a gradation value determined based on a full scale of the gradation value in the simulated image.

10. The measurement system according to claim 1, wherein:

the evaluation value is a geometric length of the sample measured from the simulated image, and the reference value is a known geometric length.

11. A method of setting a parameter of a charged particle beam device, configured to determine an ABCC parameter of the charged particle beam device using a verification device, the charged particles beam device including a charged particle optical system configured to irradiate a sample with a charged particle beam, a detector configured to detect and amplify an electron emitted from the sample in response to irradiation of the charged particle beam, an image conversion unit configured to convert a signal from the detector into a captured image, and an ABCC control unit configured to receive an ABCC (Auto Brightness Contrast Control) parameter and to set an amplification factor in the detector, the method comprising:

a first step of generating, by the verification device, a simulator input signal corresponding to the electron emitted from the sample, a second step of using, by the verification device, an arithmetic model that simulates an operation of the detector and executing, by the verification device, arithmetic processing on the simulator input signal in a state in which characteristic information is reflected in an arithmetic parameter of the arithmetic model based on the characteristic information of the detector input in advance, a third step of executing, by the verification device, arithmetic processing corresponding to the image conversion unit and converting a signal obtained in the second step into a simulated image, and a fourth step of searching for, by the verification device, the ABCC parameter with respect to the arithmetic model so that an evaluation value obtained from the simulated image becomes a specified reference value, and outputting, by the verification device, the ABCC parameter as a search result to the ABCC control unit.

12. The method of setting a parameter of a charged particle beam device according to claim 11, further comprising a fifth step of acquiring the captured image using the charged particle beam device, wherein the verification device generates, in the first step, the simulator input signal based on the captured image obtained in the fifth step.

13. The method of setting a parameter of a charged particle beam device according to claim 11, wherein the verification device generates, in the first step, the simulator input signal based on design data of the sample.

14. The method of setting a parameter of a charged particle beam device according to claim 11, further comprising a sixth step of acquiring, by a first charged particle beam device, the captured image of a reference sample having a known geometric length in a state in which the ABCC parameter is adjusted so that a geometric length measured from the captured image becomes the known geometric length, wherein:

the verification device generates, in the first step, the simulator input signal based on the captured image obtained in the sixth step, the verification device executes, in the second step, arithmetic processing on the simulator input signal in a state in which the characteristic information is reflected in the arithmetic parameter of the arithmetic model based on the characteristic information of the detector in a second charged particle beam device input in advance, and the verification device searches for, in the fourth step, the ABCC parameter so that the evaluation value becomes the reference value by defining a geometric length measured from the simulated image as the evaluation value and defining the known geometric length as the reference value.

* * * * *